United States Patent [19]
Zell et al.

[11] Patent Number: 6,036,505
[45] Date of Patent: Mar. 14, 2000

[54] MECHANISM FOR CONNECTING PRINTED CIRCUIT BOARDS OF SEPARATE DEVICES

[75] Inventors: Karl Zell, Niederpoecking; Carsten Siebold, Gilching; Walter Gerlich, Augsburg, all of Germany

[73] Assignee: Siemens Aktiengesellschaft, Munich, Germany

[21] Appl. No.: 09/106,493

[22] Filed: Jun. 29, 1998

[30] Foreign Application Priority Data

Jun. 30, 1997 [DE] Germany ................. 297 11 371 U

[51] Int. Cl.⁷ ................................... H01R 9/09
[52] U.S. Cl. .................. 439/74; 439/74; 439/928; 800/729
[58] Field of Search .................. 439/74, 928; 361/729, 361/736, 800, 816

[56] References Cited

U.S. PATENT DOCUMENTS

| | | | |
|---|---|---|---|
| 5,536,774 | 7/1996 | Tan et al. .................. | 439/76.1 |
| 5,645,434 | 7/1997 | Leung ........................ | 439/928 |
| 5,730,607 | 3/1998 | Darty .......................... | 439/74 |
| 5,768,106 | 6/1998 | Ichimura .................... | 439/74 |
| 5,838,548 | 11/1998 | Matz et al. ................ | 439/928 |

*Primary Examiner*—Renee S. Luebke
*Assistant Examiner*—T C Patel
*Attorney, Agent, or Firm*—Hill & Simpson

[57] ABSTRACT

The mechanism establishes electrical connection of two printed circuit boards of separate devices that form individual modules within a stackable module system. In order to achieve a simply constructed connection mechanism, the printed circuit boards respectively have centering or spring clips into which an adapter assembly is pluggable. The adapter assembly is thereby composed of two blade or spring clips firmly connected to one another via an adapter assembly printed circuit board, whereby the adapter assembly is surrounded by shielding covers firmly connected to one another. In the plugged condition, the adapter assemblies are conducted through housing openings in oppositely residing housing parts of the devices stacked above one another, whereby the outsides of the shielding covers contact the surrounding edges of the housing openings.

15 Claims, 2 Drawing Sheets

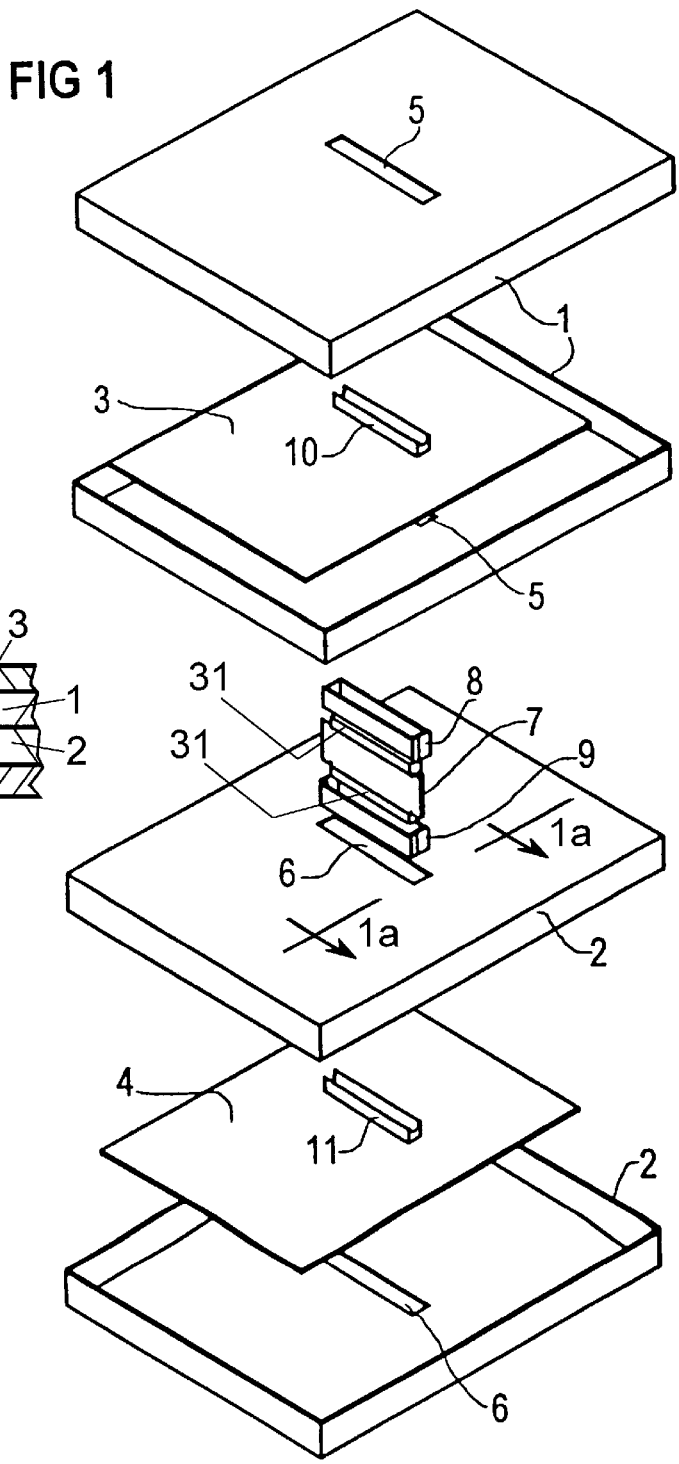

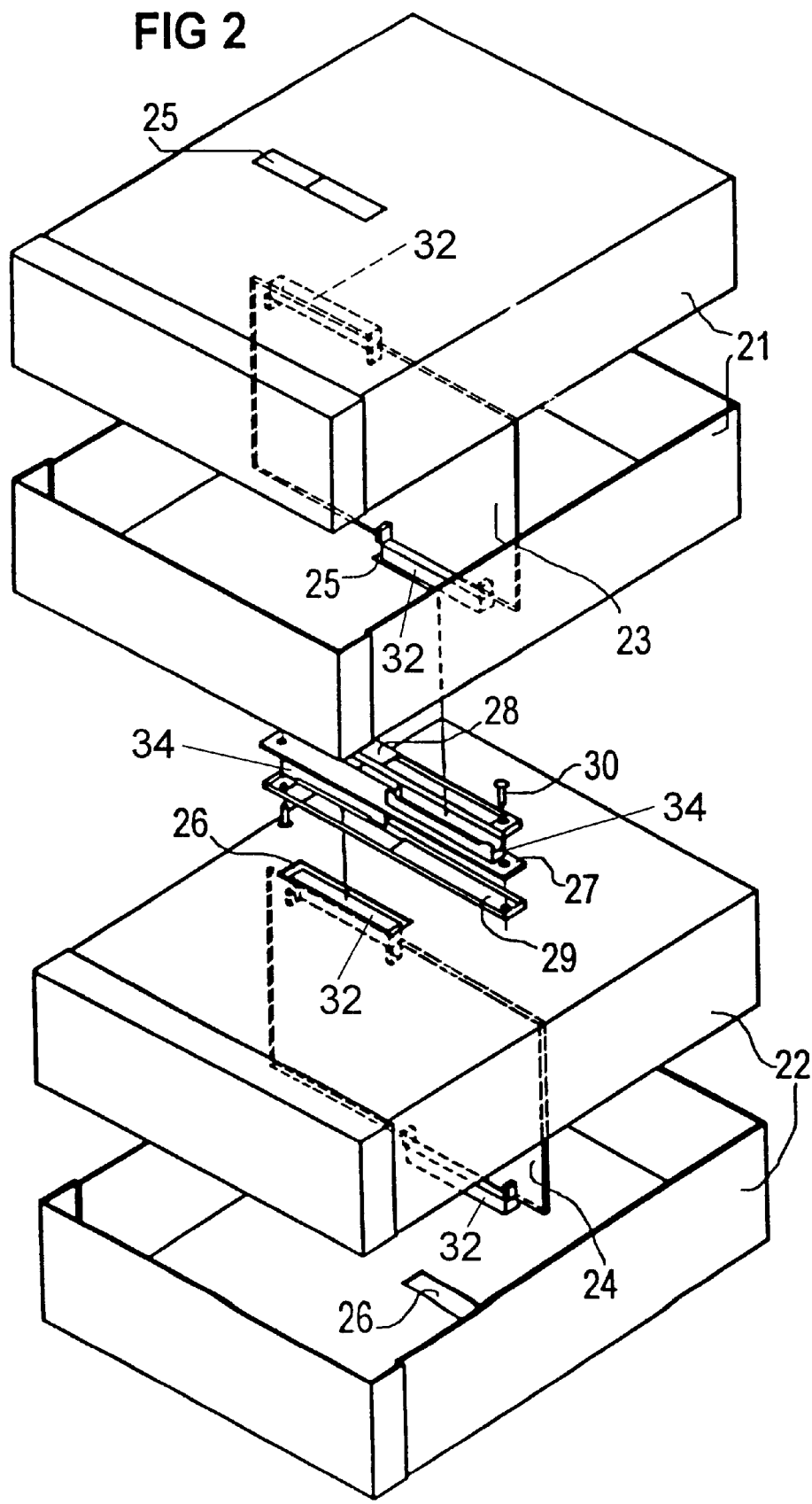

MECHANISM FOR CONNECTING PRINTED CIRCUIT BOARDS OF SEPARATE DEVICES

BACKGROUND OF THE INVENTION

The present invention is directed to a mechanism for the electrical connection of two printed circuit boards of separate devices that form individual modules within a stackable module system.

Dependent on the clock frequencies that occur, the data communication between two devices can only be realized with costly shielding. Electrical lines between the individually shielded devices often act as antennas.

Currently, the data transfer between devices is accomplished with external device cabling. Shielding problems thereby arise that can only be improved by involved and expensive shielded cables. Due to the buckling risk of the mechanically unprotected cables, mechanical problems also occur. The expensive manufacture of the device-connecting cables is also disadvantageous due to the high degree of shielding required (cable shield and grounding). Handling problems are a further disadvantage due to the juxtaposition of a multitude of cables, namely the required power and terminal cables, which are usually at the back side of the devices, in addition to the data cables.

SUMMARY OF THE INVENTION

It is therefore an object of the present invention to provide a mechanism that enables a simple shielded connection between two printed circuit boards of different devices.

In a mechanism of the aforementioned type, this object is inventively achieved in that the printed circuit boards respectively comprise centering or spring clips into which an adapted assembly can be plugged. The adapter assembly is composed of two blade or spring clips rigidly connected to one another via an adapted assembly printed circuit board, whereby the adapter assembly is surrounded by shielding covers firmly connected to one another. In the plugged condition, the adapter assemblies are conducted through housing openings in oppositely residing housing parts of the devices stacked above one another, whereby the outsides of the shielding covers contact the surrounding edges of the housing openings.

By contrast to the still high manual outlay in cable manufacture (looping the cable shield, manufacture, etc.), the fabrication of the inventive mechanism is cost-beneficial. The inventive mechanism is realized by pressing the centering or, respectively, spring clips into a printed circuit board and subsequent enveloping with two structurally identical adapter assembly shielding covers.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 is an exploded view of an inventive connection between two printed circuit boards arranged in different devices, whereby the two printed circuit boards are arranged in a horizontal plane of the devices;

FIG. 1a is a fragmentary sectional view of a portion of the inventive connection as assembled to a printed circuit board;

FIG. 2 is an exploded view of an inventive connection between two printed circuit boards arranged in different devices, whereby the two printed circuit boards are arranged in a vertical plane of the devices.

DESCRIPTION OF THE PREFERRED EMBODIMENTS

FIG. 1 shows two different devices that are respectively composed of two housing parts 1 or, respectively, 2. In these two devices, the printed circuit boards 3 and 4 to be directly connected are respectively arranged in a horizontally proceeding plane with reference to the attitude of use of the two devices belonging to a module system. The two printed circuit boards 3 and 4 have centering clips 10 or, respectively, 11 for the acceptance of the adapter assembly that is arranged between the printed circuit boards and implements the data connection.

The adapter assembly is essentially composed of an adapter assembly printed circuit board 7 having spring clips 31 attached at opposite edge regions and two shielding covers 8 and 9 surrounding the printed circuit board and the two spring clips 31. The shielding covers 8 and 9 are firmly connected to one another.

Housing cut-outs 5 and 6 through which the adapter assemblies are plugged for connection of the two printed circuit boards 5 and 6 are provided in the housing parts 1 and 2. The housing cut-outs 5 and 6 ain Uncovered, for example, by removing or breaking off shielding springs. The adapter assembly is then plugged into these housing cut-outs 5, 6 and the next device is placed thereon. Since the two devices belong to a module system, they are arranged at a specific spacing parallel to one another, whereby the length of the adapter assembly is matched to this spacing. In the plugged condition, the outer surfaces of the adapter assembly shielding covers 8, 9 contact the edges of the housing cut-outs 5, 6 in the housing parts 1 and 2, so that a complete shielding of the data connection between the printed circuit boards 3, 4 of the two devices is established.

In conjunction with suitable device feed, it is not only the electrical and shielding-oriented but also the mechanical connection between the devices that is assured (stack technique of the individual modules). The system can be easily subsequently supplemented by corresponding modules or, respectively, devices. As a result of its compact and mechanically stable structure, the adapter assembly can also be employed as a bearing connector element.

FIG. 2 shows two other different devices that are respectively composed of two housing parts 21 or, respectively, 22. In these two devices, the printed circuit boards 23 and 24 to be directly connected are respectively arranged in a vertically proceeding plane with reference to the attitude of use of the two devices belonging to a module system. The two printed circuit boards 23 and 24 have centering clips 32 for the acceptance of the adapter assembly that is arranged between the printed circuit boards and implements the data connection.

It is to be pointed out here that it lies at the discretion of the user whether centering clips are allocated to the printed circuit boards and spring clips to the adapter assemblies or vice versa.

Since the entire cross-section of the device is often filled up by the printed circuit boards given a vertical arrangement of the printed circuit boards to be connected, a space-saving structure of the adapter assembly is required in these cases.

The adapter assembly shown in FIG. 2 is essentially composed of an adapter assembly printed circuit board 27 that extends perpendicular to the planes of the printed circuit boards 23, 24 to be connected. The two centering clips 32 are thereby attached to the underside and the upper side of the adapter assembly printed circuit board 27 offset relative to one another, and the shielding covers 28 and 29 surrounding the printed circuit board and the spring clips 34 in the form of two blade clips comprise appropriate openings for the centering clips 32. The covers 28 and 29 are firmly connected to one another.

Housing cut-outs 25 and 26 through which the adapter assemblies are plugged for connection of the two printed circuit boards 23 and 24 are provided in the housing parts 21 and 22. The housing cut-outs 25 and 26 are uncovered, for example, by removing or breaking off shielding springs. The adapter assembly is then plugged into these housing cut-outs 25, 26 and the next device is placed thereon. Since the two devices belong to a module system, they are arranged at a specific spacing parallel to one another, whereby the length of the adapter assembly is matched to this spacing. In the plugged condition, the outer surfaces of the adapter assembly shielding covers 28, 29 contact the edges of the housing cut-outs 25, 26 in the housing parts 21 and 22, so that a complete shielding of the data connection between the printed circuit boards 23, 24 of the two devices is established.

The comments in conjunction with FIG. 1 are to be referenced with respect to the mechanical connection of the two devices.

By contrast to the still high manual outlay in cable manufacture (looping the cable shield, manufacture, etc.), the fabrication of the inventive mechanism is cost-beneficial. The inventive mechanism is realized by pressing the centering or, respectively, spring clips into a printed circuit board and subsequent enveloping with two structurally identical adapter assembly shielding covers.

The printed circuit boards to be connected can be a matter of backplanes or motherboards of a system.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A mechanism for electrical connection of two printed circuit boards of separate devices that form individual modules within a stackable module system, the mechanism comprising:

each of the printed circuit boards having a centering clip into which an adapter assembly is pluggable;

an adapter assembly having two spring clips firmly connected to opposite edges of an adapter assembly printed circuit board, the adapter assembly being surrounded by shielding covers firmly connected to one another, the centering clips of the printed circuit boards being pluggable into the spring clips of the adapter assembly;

in a plugged condition, the spring clips of the adapter assembly and the shielding covers being received through housing openings in oppositely residing housing parts of the devices stacked above one another, whereby outside surfaces of the shielding covers contact surrounding edges of the housing openings.

2. The mechanism according to claim 1, wherein the two printed circuit boards are arranged confronting one another in parallel but spaced apart planes, and the adapter assembly printed circuit board is arranged perpendicular to the printed circuit boards to align with and connect to the centering clips secured on the two printed circuit boards.

3. The mechanism according to claim 1, wherein the two printed circuit boards are arranged spaced apart and co-planar with one another, and the adapter assembly printed circuit board is arranged perpendicular to the printed circuit boards and wherein the centering or, respectively, spring clips secured on the printed circuit boards are also co-planar with the printed circuit boards.

4. The mechanism according to claim 1, wherein the spring clip is a blade clip.

5. The mechanism according to claim 1, wherein the centering clip is a spring clip.

6. A mechanism for electrical connection of two printed circuit boards of separate devices that form individual modules within a stackable module system, the mechanism comprising:

each of the printed circuit boards having a fit clip;

an adapter assembly having two second clips firmly connected to opposite edges of an adapter assembly printed circuit board, the adapter assembly being surrounded by shielding covers firmly connected to one another, the first clips of the printed circuit boards being pluggable into the second clips of the adapter assembly;

in a plugged condition, the second clips of the adapter assembly and the shielding covers being received through housing openings in oppositely residing housing parts of the devices stacked above one another, whereby outside surfaces of the shielding covers contact surrounding edges of the housing openings.

7. The mechanism according to claim 6, wherein the two printed circuit boards are arranged confronting one another in parallel but spaced apart planes, and the adapter assembly printed circuit board is arranged perpendicular to the printed circuit boards to align with and connect to the first clips secured on the two printed circuit boards.

8. The mechanism according to claim 6, wherein the two printed circuit boards are arranged spaced apart and co-planar with one another, and the adapter assembly printed circuit board is arranged perpendicular to the printed circuit boards and wherein the first clips secured on the printed circuit boards are also co-planar with the printed circuit boards.

9. The mechanism according to claim 6, wherein the first clips are centering clips.

10. The mechanism according to claim 6, wherein the first clips are spring clips.

11. The mechanism according to claim 6, wherein the second clips are blade clips.

12. The mechanism according to claim 6, wherein the second clips are spring clips.

13. A mechanism for physical and electrical connection of two printed circuit boards of separate devices that form individual modules within a stackable module system, the mechanism comprising:

each of the printed circuit boards having a first clip;

an adapter assembly having at least two second clips firmly connected to opposite edges of an adapter assembly printed circuit board, the adapter assembly being surrounded by shielding covers firmly connected to one another, the first clips of the printed circuit boards being pluggable into the second clips of the adapter assembly;

in a plugged condition, the second clips of the adapter assembly and the shielding covers being received through housing openings in oppositely residing housing parts of the devices stacked above one another, whereby outside surfaces of the shielding covers contact surrounding edges of the housing openings to form complete shielding of a data connection being the two printed circuit boards.

14. The mechanism according to claim 13, wherein the two printed circuit boards are arranged confronting one another in parallel but spaced apart planes, and the adapter assembly printed circuit board is arranged perpendicular to the printed circuit boards to align with and connect to the first clips secured on the two printed circuit boards.

15. The mechanism according to claim 13, wherein the two printed circuit boards are arranged spaced apart and co-planar with one another, and the adapter assembly printed circuit board is arranged perpendicular to the printed circuit boards and wherein the first clips secured on the printed circuit boards are also co-planar with the printed circuit boards.

* * * * *